United States Patent [19]
Klein

[11] Patent Number: 5,859,786
[45] Date of Patent: Jan. 12, 1999

[54] PROCESS FOR COMPUTER-AIDED GEOMETRY MODELING

[75] Inventor: Rüdiger Klein, Berlin, Germany

[73] Assignee: Daimler-Benz AG, Stuttgart, Germany

[21] Appl. No.: 818,118

[22] Filed: Mar. 14, 1997

[30] Foreign Application Priority Data

Mar. 15, 1996 [DE] Germany .................. 196 12 016.0

[51] Int. Cl.$^6$ .............. G06F 17/50; G06F 19/00
[52] U.S. Cl. .............. 364/578; 345/420; 345/419; 364/468.04
[58] Field of Search ............... 364/578, 468.03, 364/468.04, 468.25; 345/418, 419, 420, 433, 440; 395/118, 119, 120, 133, 140

[56] References Cited

U.S. PATENT DOCUMENTS

| | | | |
|---|---|---|---|
| 4,736,306 | 4/1988 | Christensen et al. | 364/513 |
| 4,797,842 | 1/1989 | Nackman et al. | 364/578 |
| 4,944,034 | 7/1990 | Ohsawa | 364/522 |
| 4,953,106 | 8/1990 | Gansner et al. | 364/521 |
| 5,003,498 | 3/1991 | Ota et al. | 364/522 |
| 5,251,290 | 10/1993 | Pabon | 395/120 |
| 5,272,642 | 12/1993 | Suzuki | 364/474.24 |
| 5,282,140 | 1/1994 | Tazawa et al. | 364/468 |
| 5,379,225 | 1/1995 | Tazawa et al. | 364/468 |
| 5,452,238 | 9/1995 | Kramer et al. | 364/578 |
| 5,497,451 | 3/1996 | Holmes | 395/120 |
| 5,510,995 | 4/1996 | Oliver | 364/474.24 |
| 5,552,995 | 9/1996 | Sebastian | 364/468.03 |
| 5,581,672 | 12/1996 | Letcher, Jr. | 395/120 |
| 5,594,651 | 1/1997 | St. Ville | 364/468.04 |

OTHER PUBLICATIONS

Christoph M. Hoffman and Robert Juan An Editable, High–Level Representation for Geometric Design and Analysis.

Primary Examiner—Kevin J. Teska
Assistant Examiner—Russell W. Frejd
Attorney, Agent, or Firm—McGlew and Tuttle

[57] ABSTRACT

A process and system for the computer-aided geometry modeling which makes possible a declarative, sequence-independent description of geometric shapes and geometric features and leads to an integrated modeling, which unites in itself geometric relationships and connects them with non-geometric information. To achieve this, the geometry-related information is represented in the form of a representation element, to which a density ($\rho$) is assigned in the form of a real number. The linking of individual representation elements is performed by a single commutative and associative linking operation. A volume level, a topology level, and a generic area and edge level located between these levels are provided as the description levels for the actually relevant information. A feature level, at which features are defined and at which a knowledge-based system can be used, is located above these description levels.

17 Claims, 5 Drawing Sheets

---- topological elements without material ("air")

---- topological elements within the material

—— "normal" topological element at the boundary between material and air

—— topologic "defines" relations
----- topologic "constrains" relations

SOL = { ..., b1:body, c1:cyl, c1.top=b1.face1, c1.bottom=b1.face2,...}

Generic Levels

Topological Levels

Generic Levels

Topological Levels

PROCESS FOR COMPUTER-AIDED GEOMETRY MODELING

FIELD OF THE INVENTION

The present invention pertains to a process and system for the computer-aided geometry modeling of a workpiece.

BACKGROUND OF THE INVENTION

In many applications, computer-aided geometry modeling imposes high requirements on the methods and algorithms used. This applies to the description of regular geometries and freely shaped areas alike. At the same time, the close integration of the "naked" geometric description with other aspects, such as functionality, material properties, tolerances, etc., is of great significance for many users. To meet this demand, both research and many software companies developed concepts by means of which the necessary improvement is said to be achieved in the representation capabilities. A further increase in the performance of CAD/CAM systems and of the geometry modeling contained therein shall be achieved by a close integration of geometry and knowledge based processing techniques (cf. Krause et al., Feature Processing as Kernel for Integrated CAE Systems, IFIP International Conference, May 1994, Valenciennes). Information units (features) are a key concept for this integration: They represent a kind of bundling of geometry and geometry-related knowledge.

The CSG method (Constructive Solid Geometry), the B-Rep method (Boundary Representation) and various concepts of feature modeling [e.g., the EREP method (cf. Hoffmann et al., EREP—an Editable, High-Level Representation for Geometric Design and Analysis, Technical Report, Purdue Univ., West Lafayette, 1994) or Rieger, E.: Semantics-Oriented Features for Continuous Support of Product Design, Hanser Verlag, Munich, 1995] have already been known for geometry modeling.

From the viewpoint of a knowledge-based system, the main problem of the CGS modeling is the history-based (sequence-dependent) description of the geometry.

Due to missing information, the Boundary Representation Method is only partly able to be integrated with knowledge-based techniques. This information comprises the topological and generic area-related information and the relationships between them, but not the relationships with volumes and volume-related features.

The EREP method currently represents one of the most expressive feature concepts. It is based on the idea of providing a representation of geometric shapes which exists independently from the "actual" geometric calculation in a geometry modeler and as such can, e.g., also be edited. This is achieved by two central starting points:

The provision of a formal description language, in which the feature and consequently also the geometry can be defined in such a way that is independent from a geometry modeler. This mode of representation is based on a sweeporiented geometry modeling; features can be described by establishing "from-to" relationships between them and already existing features (more precisely their areas or faces). To achieve the necessary flexibility of the representation, degrees of freedom can be utilized in the geometry modeling in this prior-art method due to the presence of special geometric relationships (constraint techniques).

The goal is to utilize independent possibilities of the geometric description as well as the integration of constraint methods in geometry modeling.

The feature modeling in the prior-art method is based on a procedural approach, while no attention is paid at first to the declarativity of the representation of the geometry. The integration of different aspects of geometry modeling, namely, volume-related, area- and topology-relevant information, in an integrated manner and with regard to the treatment of a mutual dependence is missing.

The above-described feature concepts satisfy only some of the requirements to be imposed on an integration with knowledge-processing systems. The essential weak points can be summarized as follows:

The expression capabilities are often too weak in the feature representations: They are either based on volume-oriented, part-oriented or sweep-oriented geometry modeling representations, and offer too few representation capabilities for the other "modes of view." The of defining relationships between different features and of building up a hierarchy of features are often too weak.

Feature interactions cannot be described with the necessary expressiveness. This applies especially to design-oriented feature concepts, while greater importance is usually attached to this aspect in concepts for the manufacturing feature.

It is especially problematic from the viewpoint of knowledge representation that most feature concepts are still based on a procedural approach. They are more or less a kind of "macro," with which a predefined sequence of instructions can be given for the geometry modeler and these instructions can be activated.

Both the question of the existing possibilities of expression and a declarative description are essential for a feature concept that is to act as a link with the knowledge representation. Possibly all relationships in geometry and between geometry and other aspects (such as material, tolerances, etc.) must be able to be adequately described, and this must be able to be done in a declarative manner, in which the significance of the description arises from itself, regardless of the underlying processing model.

Prior-art types of geometry modeling lead to the circumstance that neither of the above-mentioned two goals, namely, possibilities of expression and declarativity, can be achieved to the necessary extent. The use of volume- or area-oriented geometric description limits the representation of relationships of the other "level," and the sequential (sequence-based) form of the modeling of geometric shapes prevents a declarative approach. This procedure also collides with the necessary interactive mode of operation, in which not only does the designer build up geometry step by step, but also discards, revises, modifies it, etc. Based on the previously compulsory sequence-based geometry operations, the designer frequently performs geometry operations which are not particularly intuitive: To avoid a lengthy setback in the sequence of operations performed in the case of a necessary revision of the geometry, new geometry operations are attached, and even though these geometry operations ultimately bring about the same overall geometry as would have been caused by the revision of earlier steps, their meaning is understandable in this context only.

In addition, the loss of information, which is the result of the representation of the geometries of a Boundary Representation, frequently causes problems, e.g., when obtaining manufacturing-relevant representations (NC programming) from the geometry or when aspects of manufacturing are taken into account during the design process (in the sense of a Concurrent Engineering).

SUMMARY AND OBJECTS OF THE INVENTION

The primary object of the present invention is to provide an expressive and declarative description of geometric information units (features) and relationships in the computer-aided geometry modeling of a workpiece. Information units according to the present invention are those which carry both geometric and other ("semantic") information. The desired method shall offer an integrated, declarative, logic-based modeling of features and geometries, which combines in itself volume-, area-, line-, point- and topology-related geometric information and connects it with non-geometric information. A high-performance interface shall be created between geometry modeling and knowledge processing.

According to the invention, a process and system for the computer-aided geometry modeling of a workpiece is provided including an integrated, declarative, IS sequence-independent and logic-based representation of volume, area, edge, point and topology-related information in the form of a representation element ($\Gamma$). The representation element ($\Gamma$) comprises individual basic volumes, to which a density ($\rho$) is assigned in the form of a real number (positive, zero, negative). The linking of individual representation elements ($\Gamma$) is performed by a commutative and associative linking operation. Description levels are created for the actually relevant information, also in their mutual dependence, in the form of a volume level as the basic level for the description of elementary structures, whose composition is permanently preset, topology level as a representation of the overall geometry, a generic area level located between the volume level and the topology level, and a generic edge level likewise located between the volume level and the topology level for establishing the relationship between the topological structures and the volumes generating them.

The process and system further preferably creates an information unit level (the feature level) located above the description levels, at which objects (features) are defined in terms of their volume-, area-, point- and topology-related information with their attributes as well as the relations and dependences existing between them in the description levels.

The process and system further preferably uses a knowledge-based system which utilizes the possibilities of the geometry and feature description.

The process and system further preferably provides two different types of topological relations each, one of which ("defines") describes the topology in the usual manner, while the other ("constrains") expresses that an object influences the topology of another object without being influenced itself, in the topology level both between areas and edges and between edges and points. Geometric models are preferably a priori classified topologically in their description. A relation ("holds"), which states whether a defined topological, generic or volume instance is present in a current geometric model, is introduced for the topology level. The overall geometry is represented for each total set of decisions, and the subset of decisions which has led to a particular relationship is represented in it for every individual relationship with respect to the total set of decisions, so that parts of the geometry which are linked with these decisions can be identified at the time of a change in the decisions.

Prior-art feature concepts are based essentially on the prior-art manner of geometry modeling and place a description level on it, by means of which both more complex geometric shapes ("geometric features") and relationships between geometry and other information ("semantic features") can be described. Consequently, the possibilities of expression of the feature concept depended before mainly on the possibilities of the actual geometry modeling. The present invention advantageously takes the opposite approach: The starting point for the concept is the desired expressiveness and the requirement of a declarative representation as a central prerequisite for the integration of knowledge processing and geometry, i.e., the process according to the present invention is used mainly to obtain a high-performance interface between geometry modeling and the knowledge-processing system.

The feature representation in the process according to the present invention makes it possible to express a plurality of different relationships (constraints), which are taken into account in deriving the complete geometric information for the geometry modeling. Due to its special mode of operation, the geometry modeling ensures that the sequence in which the problem solver (knowledge-based system) "supplies" it with information is irrelevant for the resulting overall geometry.

It is ensured by the level structure that all relevant information is represented where they have their place; and all relationships between the different aspects of geometry modeling (volumes, areas, parameters, topology) are part of the overall representation, i.e., they are not lost. In this sense, the process according to the present invention is not only a hybrid, but also an integrated modeling approach. Due to the explicit representation of all relevant geometric information, it is possible to completely integrate these relationships in the knowledge processing (and to use it as constraints for the corresponding "entities").

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
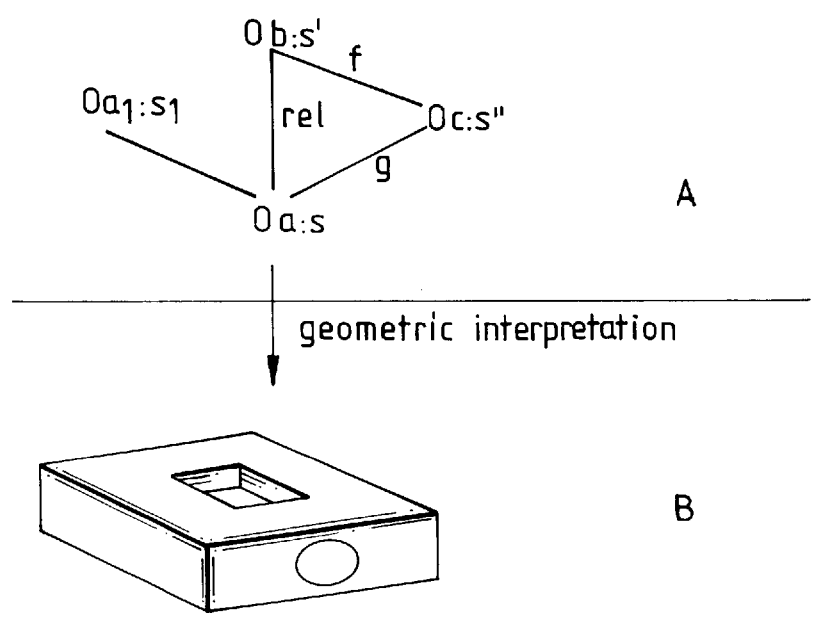
FIG. 1 is a diagram showing a declarative feature and relationship level and its representation to geometry.

Referring to the drawings in particular, the invention achieves the goal of an expressive and declarative geometry and feature modeling, which takes into account the special needs of knowledge processing, wherein two questions shall be investigated:

What kind of geometric and other information must be represented and in what structure?

How does a geometry modeler and, in interaction with this, a knowledge-based problem solver look like in order to thus achieve this kind of geometric description?

The present invention assumes that the geometry modeler itself is modified in such a way which ensures its ability to be matched to the feature modeling given by the process according to the present invention. These modifications consist, on the one hand, of a specific type of geometric representation: More geometric information must be preserved and treated than in prior-art methods. On the other hand, a certain limitation of the geometric linking operations, which is possible at the geometric level, is necessary.

On the side of the problem solver, a high-performance "constraint machine" is necessary, which ensures that all the information that is contained in a given representation (even implicitly) is indeed available (i.e., can be derived).

A knowledge-based problem solver, e.g., an intelligent design assistant, which supports the designer in solving design problems, must be able both to "extract" knowledge from the geometry modeling (by retrieval, abstraction, classification, etc.) and to induce the geometry modeler to make certain changes in the geometry model (to add or take away geometry, to change parameters, to perform local geometry manipulations, etc.).

Depending on the specific type of the problem, for which the problem solver was designed, these interactions may have different intensities, and they can be incorporated differently in the overall context. For design tasks, the goal is, e.g., typically to ensure that the (partial) solution generated up to this point, including the geometry, meets the preset task, on the one hand, and, on the other hand, that it is consistent (i.e., it satisfies a set of different constraints).

Some of the core requirements, which are imposed on the geometry modeling from the viewpoint of a knowledge-based system, will be reviewed below. What is more important here is the quality of the requirements rather than technical details.

The knowledge which the problem solver has about the (partial) solution generated can be represented in the problem solver in different forms. However, it will typically comprise knowledge about objects (including geometric feature) and about their properties and relationships, including the geometric ones. This knowledge can be represented, e.g., in a predicate-logical or comparable language, in which the following relationships can be expressed, among other things:

Objects are described by an identifier a, b, c (e.g., 'hole 1' or 'slot 2') and by their belonging to a type s, s' (e.g., 'through-hole' or 'slot') (in the form a:s, i.e., e.g., 'hole 1: through-hole');

attributes f, g (e.g., 'length,' 'top-face') are used to describe unambiguous (functional) relations between objects (as a.f=b); and any relations rel (e.g., 'connected,' 'on') between objects a and b can be represented in the form rel (a,b) (e.g., 'connected (hole 1, slot 2)').

A (partial) solution $SOL_i$ can then be represented as a set of such expressions for a given problem:

| | | |
|---|---|---|
| $SOL_1$ | = | [hole 1:through-hole, slot 2:slot, hole 1.top-face |
| | = | face 12, connected (hole 1, slot 2), . . .]. |

By means of the generally valid knowledge, which the problem solver and the geometry modeler have, the complete—including geometric—description of this partial solution shall be able to be derived from this description, on the one hand, and it shall be ensured that this solution is consistent, i.e., it meets all requirements. (It is assumed here that all the information needed for the complete description of the geometry is made available by the problem solver.) The sequence in which the knowledge (the individual expressions) has entered the partial solution is not relevant for its meaning and consequently for the interpretation of the partial solution $SOL_i$ as a whole.

In FIG. 1, part A shows in this sense a declarative description of features and relations, which are converted into the geometric model shown in area B by means of geometric interpretation (this transformation is indicated by an arrow).

Such a procedure is not supported by the geometry modeling methods developed before: The overall geometry depends there on the sequence in which the individual partial geometries are linked with each other. If the necessary expressiveness is considered, two questions are especially important for the interaction between the knowledge-based problem solver and the geometry modeler:

1. Is it possible to express all geometric relationships which are important for the problem solver in a feature concept? Is it possible, e.g., to represent both volume-oriented links and area-, line- or point-related relationships?
2. Is there a possibility of expressing generic knowledge about geometric shapes and relationships, in the necessary general form, i.e., especially the "degrees of freedom," constraints, etc., which are needed for this?

In light of the large amount of information which a geometry modeler has to handle, the question as to the expressiveness is also always a question of practicability. It hardly seems to be realistic to make available to the problem solver all the information which the geometry modeler has. It is therefore important to take into account the following in the interaction of the knowledge-based system and the geometry modeler:

The possibilities of expression at the interface between the two systems, i.e., in the process according to the present invention, must be such that precisely those geometric relationships can be described which are important for the problem solver. This also applies to the relationships for which the geometry modeler is "competent," i.e., e.g., topological conditions which must be satisfied or avoided. To do so, the geometry modeler must be able to specifically signal for the problem solver those changes in geometry which arise from a certain "action" of the problem solver and are of interest to the problem solver.

It is clear in many applications that, e.g., not all that would be possible "in principle" (geometrically) does actually happen. It should thus be possible for reasons of efficiency not to burden the problem solver with such things.

Consequently, such "irrelevant" relationships are represented exclusively at the geometry level, but they are not visible to the knowledge-based system.

Knowledge-based systems typically search for a solution. The solution is generated incrementally. Since control aspects are already complicated enough anyway, it would be (and still is) an additional complication if it were necessary during the generation of the individual partial solutions to take into account the order in which these partial solutions are added to the overall solution. The overall solution shall be independent of the order in which it was built up, which is an important aspect of the declarative knowledge representation being examined here.

Another important point is the efficiency with which the search can be performed in the normally very large search spaces. The most intelligent procedure possible is required, which should also include, e.g., the consideration of dependences in the search.

The problem solver frequently is not searching alone: It assists the designer in his search for the solution. Consequently, the designer will want, e.g., to take back decisions made earlier and to replace them with alternatives. To preserve the overall consistency, all conclusions must be set back or recalculated in the case of such a change.

By means of the general knowledge, the problem solver can derive a set of other statements from a partial solution $SOL_i$. However, the amount of currently derivable ("valid") knowledge shall be preserved by adding new knowledge to a next partial solution $SOL_{i+1}$, and additional knowledge shall be obtained from the new plus old information. This monotony property is not always satisfied, even in other fields of application; for example, assumptions ("defaults") "once" determined are taken up in the solution because of lack of specific information, and they will later prove not to be correct (or not to be optimal) and will consequently be revised. Consequently, statements which are derived from these assumptions will be eliminated as well. To make it possible to treat such problems correctly, special mechanisms, e.g., dependence maintenance, are necessary in such problem solvers.

However, other factors, which ultimately also lead to nonmonotone behavior, also appear in geometry modeling. For example, the topology of the geometry model changes due to the addition of new partial geometries (an actually monotone operation in the sense of knowledge representation): Areas which were contiguous before are no longer contiguous; intersections of straight lines, which were contained in the model before, are now outside the model; a rectangle loses its geometric shape due to cutting off or addition and thus passes over into another "area class," etc. This leads to the question of whether geometric forms of representation can be found which support the handling of this specific type of geometric nonmonotony in the best possible manner.

Besides this type of nonmonotony, which follows from the specifics of geometry, it is important for many applications of knowledge-based techniques that they can be operated in an interactive manner, in which the user (e.g., the designer) intervenes with the problem solution. Not only does he make decisions, he also revises decisions made previously (e.g., he changes parameters or removes partial geometries from the solution).

The geometry can be changed not only by adding or removing partial geometries, but—if the representation offers such possibilities—also by changing geometric parameters. Other parameters linked by constraints may also change as a result under certain circumstances (constraint propagation). This may also lead to changes in the topology of the geometry.

To ensure the overall consistency, both the change in the structure of the geometry and in the parameters require dependence maintenance, by means of which it is possible to describe what changes are necessary as a consequence of other changes.

This possibility of revision, including dependence management, is an indispensable prerequisite for a complete interactive mode of operation of the geometry modeler.

It is first necessary to summarize the most important requirements which must be imposed on a high-performance feature concept, so that it will support especially the interaction between a knowledge-based problem solver and a geometry modeler. This interaction is intended to be such that the knowledge-based component makes available, by logic inferences, constraint propagation, etc., all the information which the geometry modeler needs to generalize a geometric representation from it (see FIG. 1). The specifics of the process according to the present invention consists above all of two points:

1. The feature representation makes it possible to express a plurality of different relationships (constraints), which are taken into account for the geometry modeler at the time of the derivation of the complete geometry information.

2. Due to its special mode of operation, the geometry modeler ensures that the sequence in which the problem solver "supplies" it with information is irrelevant for the resulting overall geometry.

Before describing later how the knowledge-based problem solver "processes" the feature modeling, it will first be explained how the geometry modeler guarantees the satisfaction of the said two requirements (possibilities of expression and sequence independence).

To satisfy these requirements, the process according to the present invention is based on three ideas:

Firstly, there are possibilities of description at different levels: In the process according to the present invention, geometric shapes and relationships can be described both in a volume-, area-, line-, point- and topology-oriented manner and in their mutual dependences. Sweep representations and freely shaped areas are also integrated. This level structure guarantees that a) all relevant pieces of information are represented where they have their place, and b) all relationships between the different aspects of geometry modeling (volumes, areas, parameters, topology) are part of the overall representation, i.e., they are not lost.

Due to the explicit representation of all relevant geometry information in the process according to the present invention, it is possible to fully integrate these relationships during the knowledge processing (and to use them, e.g., as constraints for the corresponding "entities").

It is also particularly important to ensure the declarativity of the representation, especially when linking partial geometries. This makes it necessary, in particular, to eliminate the sequence dependence of "conventional" geometric links. This is achieved by introducing by the process according to the present invention only one linking operation, hereinafter called ⊗, which is both commutative and associative. A—positive or negative—density ρ is assigned to each volume, and the linking of the volumes is performed corresponding to the actual densities.

The central representation element in the process according to the present invention is a geometry solid or body (solid) Γ. This is defined by the integrated representation of the geometric, i.e., volume-, area-, edge-, point- and topology-related information pertaining to it. A solid either consists of a basic volume V $$\Gamma = \{V\}$$

or it is formed as a result of the linking operation or composition operation ⊗ of two solids $\Gamma_1$ and $\Gamma_2$:

if $\Gamma_1 = \{V_1, V_2, \ldots V_n\}$ $\Gamma_2 = \{V'_1, V'_2, \ldots V'_m\}$, then $\Gamma = \Gamma_1 \otimes \Gamma_2$ $= \{V_1, V_2, \ldots V_n\} \cup \{V'_1, V'_2, \ldots V'_m\}$.

To secure the sequence independence, this linking operation is commutative and associative:

$\Gamma_1 \otimes \Gamma_2 = \Gamma_2 \otimes \Gamma_1$ $(\Gamma_1 \otimes \Gamma_2) \otimes \Gamma_3 = \Gamma_1 \otimes (\Gamma_2 \otimes \Gamma_3)$.

How exactly this linking is to achieve these goals will be described below.

The analog to the CSG unifying operation is consequently described as an ⊗ linking of two positive or two negative volumes, and the analog to the CSG difference formation as the ⊗ linking of one positive volume and one negative volume.

As a third important step in the process according to the present invention, the possible explicit modeling of volume-, area-, line-, point- and topology-related geometric information in their mutual dependence makes it possible to define various forms of constraints between these representations. As a result, the feature concept in the process according to the present invention acquires its high expressiveness. The relevant relationships can be formulated at each of the description levels in the form of corresponding logic, topological and arithmetic (geometric) constraints.

Figure 2:
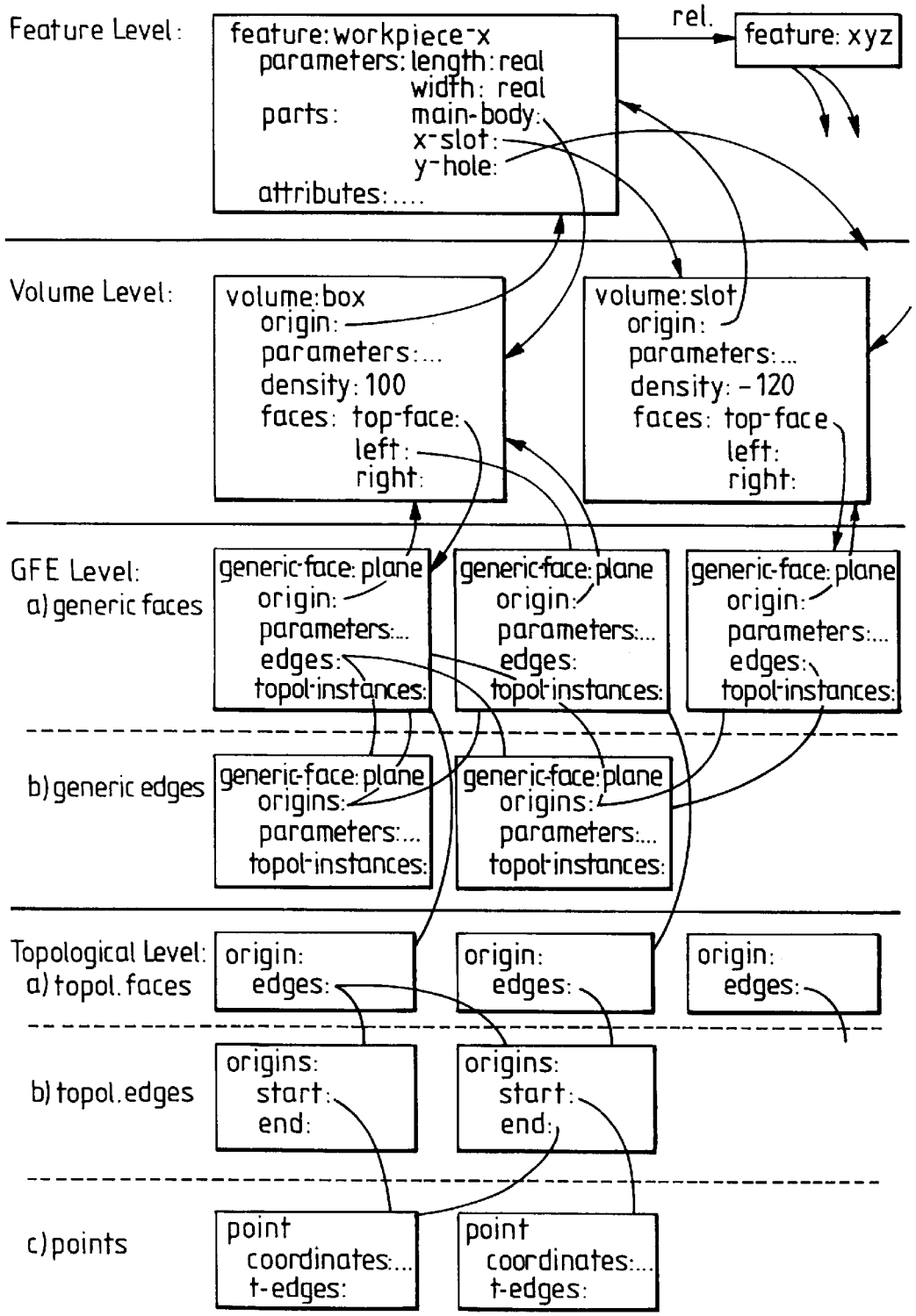
FIG. 2 is a diagram showing description levels according to the present invention and their dependences.

Geometric shapes and relationships are described at three levels in the process according to the present invention. These are:

a) The volume level:

Geometry modeling is performed here primarily in a volume-oriented manner. These basic volumes may be both elementary (sphere, cylinder, box, etc.) and be composed of other shapes, and, contrary to the feature level (which will be explained later) and to the solids, the manner of composition is permanently preset here and its inner structure cannot be varied. However, basic volumes can be flexibly defined at the feature level, by using different forms of constraints (see FIG. 2).

b) The generic level:

The generic areas and edges are described at this level. It results from the interaction of the areas which form the individual volumes (both within one volume and between different volumes). The type and parameter information of the areas and edges belongs to this level. The generic edges are the result of the interaction of areas of one or two volumes. Both aspects are essential for the adequate and efficient treatment of structural and parametric changes and for the representation of the corresponding dependences.

The generic level comprises two sublevels, namely, the generic surface level and the generic line level. The meaning of this level is mainly to form the interface between the volume description and the topology. The geometric information on the individual topological "entities" is represented here, and the relationship between these and the volumes generating them is established. There is an unambiguous assignment between the generic areas and the volumes "generating" them as well as the generic edges and the generic areas from the section of which they are formed. The other volumes, areas, etc., which are present, do not affect this, contrary to the topology, which lacks this locality property. This distinction is important for the treatment of the constraints and dependences.

Geometric constraints between generic areas and edges and arithmetic constraints between the parameters characterizing these objects can be defined at this level. A special form of constraints is the equality constraints, which express that two corresponding objects have the same geometric identity.

c) The topology level:

The lowest description level in the process according to the present invention is the topology level. It represents, in conjunction with the higher levels, the "actual" geometry. Contrary to the generic level, at which there are clear assignments to the corresponding volumes, the topology is the result of all partial geometries involved. Each topological unit (with the exception of the points) has an unambiguous relation to a corresponding unit at the generic level, which contains the corresponding geometric information. The topology level is divided into three sublevels, corresponding to the dimension of the units involved: Areas, edges and points. The connection between the elements at the individual sublevels forms a complete description of the topology.

The process according to the present invention specifically offers the following possibilities of description at the individual levels:

| | |
|---|---|
| basic-volume: volume-type | ;;; predefined basic volumes, such as |
| | ;;; box, sphere, cone, . . . or |
| origin | ;;; feature to which the basic volume |
| | ;;; belongs |
| parameters | ;;; complete set of parameters for |
| | ;;; the description of the geometric |
| | ;;; shape |
| density | ;;; real number indicating the "density" |
| | ;;; of the volume |
| surfaces | ;;; the set of limiting surfaces |
| attributes | ;;; semantic information |
| constraints | ;;; dependences between different |
| | ;;; parameters, |
| | ;;; areas, etc. |

The meaning of 'density' will be explained in detail later. To achieve the necessary flexibility in the representation, it is possible to define or overdefine the density of a basic volume in one feature.

The generic level:

| generic area level: | |
|---|---|
| generic face: type | ;;; area type (plane, cylinder |
| | ;;; jacket, . . .) |
| origin | ;;; corresponding basic volume |
| parameters | ;;; parameters necessary for the |
| | ;;; description |
| edges | ;;; sectional lines with other areas |
| topological-instances | ;;; elements at the topology level which |
| | ;;; belong to the generic area in |
| | ;;; question |
| attributes | ;;; semantic information |
| constraints | ;;; dependences between different |
| | ;;; parameters, edges, etc. |

Freely shaped areas can also be integrated in the overall representation at this level by defining them as analytical areas as part of volumes.

Generic edge level:

| | |
|---|---|
| Generic-edge: type | ;;; edge type (straight, circular |
| | ;;; line, . . .) |

-continued

| | |
|---|---|
| origins | ;;; an ordered pair of generic |
| | ;;; areas, whose intersection |
| | ;;; forms this generic edge |
| parameters | ;;; geometric parameters |
| topological-instances | ;;; a set of edge elements |
| | ;;; at the topological level, which |
| | ;;; belong to this |
| | ;;; generic edge |
| attributes | ;;; semantic information |
| constraints | ;;; dependences of |
| | ;;; parameters |

The topology level:

The topology level describes the topology of the overall geometry. The expansions which are introduced compared with the modeling known from the Boundary Representation are related mainly to two different types of relations, both between areas and edges and between edges and points. There is only one type of relation (an edge is defined by two points, and an area is topologically limited and is determined in terms of its topological integration by a closed line of edges) in a Boundary Representation. The meaning of the two types existing in the process according to the present invention is as follows: One of them ('defines') corresponds to the version known from the Boundary Representation, and the other ('constraints') means that even though there is a parameter dependence, there is no topological dependence. Any additional information that is needed to achieve a declarative geometric representation can be represented by this modified representation of the topology.

The topological area level is described as:

| topological-face: | |
|---|---|
| origin | ;;; corresponding generic area |
| edges | ;;; set of closed lines of topological |
| | ;;; edges of the type 'define' |
| con-edges | ;;; set of 'constraints' edges which |
| | ;;; are defined by the area |
| | ;;; (without influencing the topology |
| | ;;; of this area) |
| attributes | ;;; semantic information |

The topological edge level is described as:

| topological-edge: | |
|---|---|
| origin | ;;; corresponding generic edge |
| points | ;;; pair of corner points which |
| | ;;; limit an edge |
| constrains | ;;; set of points which are located |
| | ;;; on the edge, i.e., which are also |
| | ;;; defined by the edge, without limiting |
| | ;;; same topologically |
| attributes | ;;; semantic information |
| local-feats | ;;; local feature, such as roundings, |
| | ;;; bevels, . . . |

The point relations are always of the type "defines."
The (topological) point level is described as:

| | |
|---|---|
| coordinates | ;;; the coordinates of the point |
| t-edges | ;;; set of topological edges on which |
| | ;;; the point is located (distinguished |
| | ;;; as 'defines' and 'constraints') |

The individual description levels are, of course, not independent from one another in the consistent representation in the process according to the present invention: The types and parameters of the generic areas are connected with those of the corresponding volumes, the types and parameters of the edges are connected with those of the area by the intersection of which they are formed, etc. This is apparent from FIG. 2, in which the arrows indicate the linkings between the individual levels.

While the sequence (and, of course, the type of the operation) in which the individual partial geometries (volumes) are linked with each other determines how the resulting overall geometry will look like in prior-art modelers, this is achieved in the process according to the present invention by assigning a certain density (in the form of a real number) to each basic volume.

The meaning of density is easy to clarify:

1. Each point p in space has a density $\rho(p)$ in the form of a real number.
2. $\rho(p)>0$ means that "material" is present at this point p.
3. $\rho(p)\leq 0$ means that no "material" is present at this point p.
4. If a point p is not contained in any basic volume, it has the density 0 (by definition).
5. If a point p is contained in a plurality of volumes $V_1$, $V_2, \ldots, V_n$ with the corresponding densities $\rho_1, \rho_2 \ldots \rho_n$, it has the density with the highest absolute value:

$$\gamma(p)=\max\{|\rho_1|, |\rho_2|, \ldots, |\rho_n|\}$$

Figure 3:
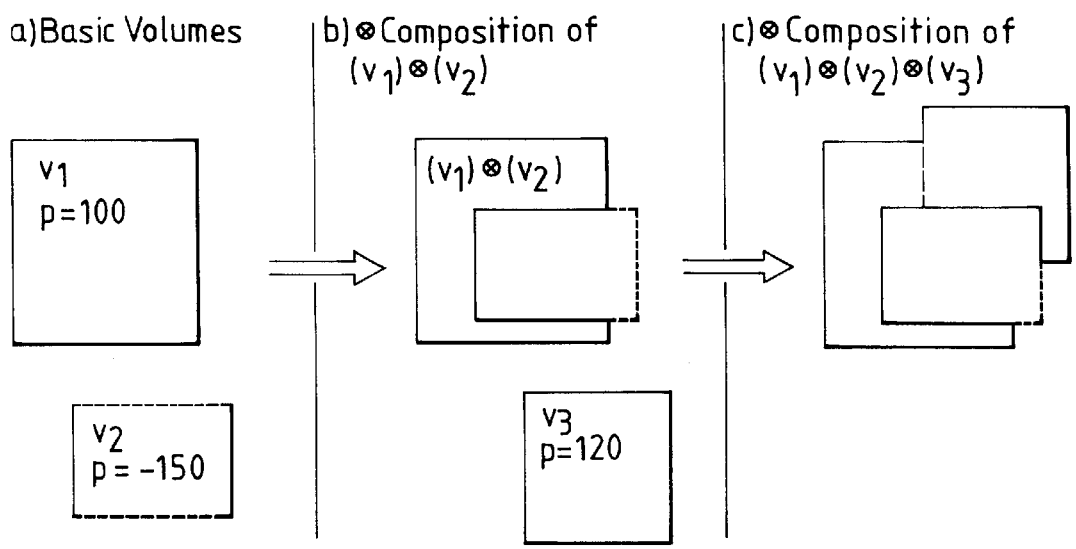
FIG. 3 is a diagram showing the linking of three volumes in two steps.

FIG. 3 illustrates this idea for three basic volumes $V_1$ (density $\rho=100$), $V_2$ (density $\rho=-150$) and $V_3$ (density $\rho=120$) with an example (which is only two-dimensional for better understanding), in which the volumes $V_1$ and $V_2$ are linked as the first step. The linking with the basic volume $V_3$ is then performed. It becomes clear that the resulting solid is defined by the densities of the individual partial geometries and is thus independent from the sequence of the linking operations. In other words, the same result is also obtained in the process according to the present invention if the basic volumes $V_1$ and $V_3$ are linked first and a linking with the basic volume $V_2$ is performed only thereafter.

Thus, each point has an unambiguously defined density. Thus, whenever linking two volumes, only the relation between the two density values is important, from which the density value of the resulting volume is obtained.

To make it possible to give a better formal description of the determination of the resulting density at the time of the linking of different volumes, a 'superior' (abbreviated as sup) relation between two volumes, here between $V_1$ and $V_2$, is advantageously introduced:

$$\sup(V_1, V_2) \text{ is synonymous with } |\rho(V_1)|>|\rho(V_2)|$$

A special case arises if the absolute values of the two densities are equal: If both densities have the same sign, no volume is superior to the other. The linking is performed with a uniform volume having the density which the two partial volumes have. However, if the signs are opposite, the negative shall be superior to the positive partial volume by definition. Thus, it "wins" over the positive one, so that material is removed in the area of overlap of the two volumes.

Figure 4A:
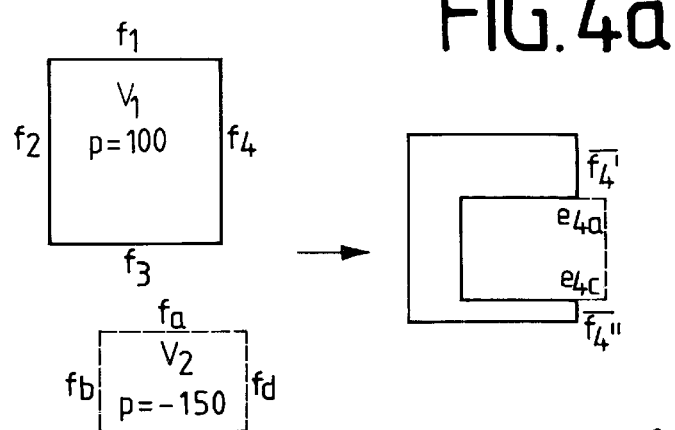
FIG. 4a is view of the generic areas of the two-dimensional "volumes" according to FIG. 3.
Figure 4B:
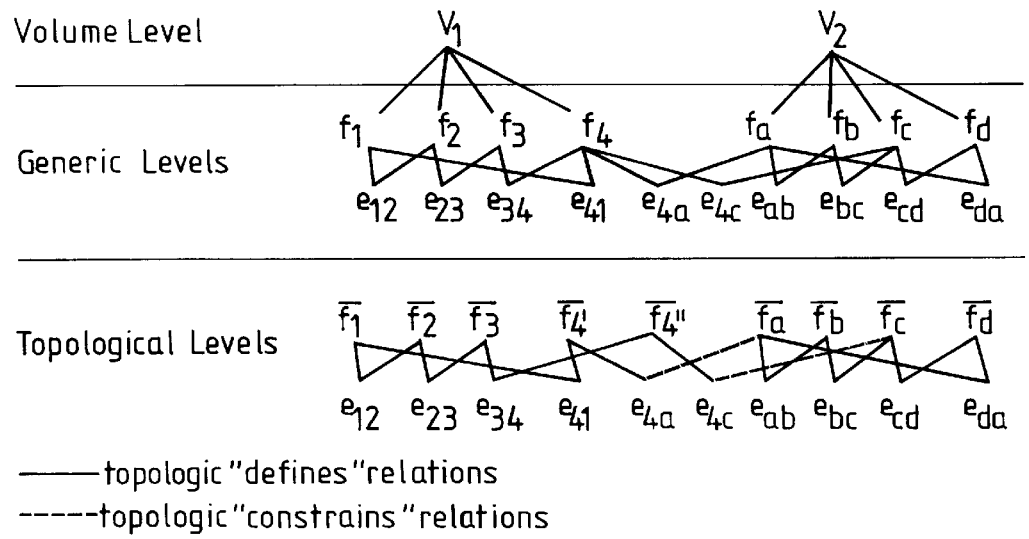
FIG. 4b is a diagram showing their description levels.

FIG. 4a describes, as an example from FIG. 3, the generic "areas" of the two "volumes" $V_1$ and $V_2$, which are preset as two-dimensional here, and FIG. 4b shows corresponding description levels. For clarity's sake, the descriptions between the generic and topological elements are not graphic here, but are indicated by the name only. The topological elements are overlined for distinction from generic ones. The areas $f_a$ and $f_b$ intersect the area $f_4$, as a consequence of which the edges $e_{4a}$ and $e_{4c}$ are formed as new edges as a result of the linking (both generic and topological). Since the basic volume $V_2$ is superior to the basic volume $V_1$, the topological elements of the basic element $V_2$ remain unchanged during the linking. The areas $f_a$ and $f_b$ of the basic volume $V_2$ "constrain" only the newly formed topological instances $\bar{f}_4'$, $\bar{f}_4''$ of the "inferior" and consequently cut area $f_4$ of the basic volume $V_1$.

It becomes clear from the definition of the geometric density for which purpose the two types of topological relations, which were explained above, are needed: The solid $\Gamma$, which is formed from the ⊗ linking of two solids $\Gamma_1$ and $\Gamma_2$, is not a homogeneous structure in itself. It consists of regions of different density. These different regions must be represented in terms of their topology: Both the regions themselves and the relations between adjacent regions.

The linking of two solids means conceptually that each basic volume of one solid interacts with each basic volume of the other solid. This interaction may be such that there is no overlap. However, if there is one, the basic volume that is superior to the other "gains" in a linking of two basic volumes having different densities. In other words, the topology of this basic volume also remains unchanged in the linking operation with the other volume, and only the weaker volume is "incised" and its topology will thus change. At the same time, the topology of the incised volume is determined by the stronger volume, so that a representation of this mutual dependence by "constrains" relations is necessary.

Since each area is unambiguously assigned to a volume, it must always be unambiguously decided in connection with the linking of different volumes which density is on each side of the area and at the cut edges of different areas. Since the superior relation depends on the absolute values of the densities, the resulting topology also contains elements which circumscribe volumes with negative density (as is indicated in FIG. 3). The detail-type modeling corresponding to the example in FIG. 4$b$ from the volume level to the topology via the generic levels shows clearly how the topology of the overall geometry changes due to the addition of the basic volume $V_2$: While the topology of the "weaker" basic volume $V_1$ is modified (e.g., by dividing the topological area $\bar{f}_4$ into the parts $\bar{f}_4'$ and $\bar{f}_4''$, the topology of the basic volume $V_2$ remains intact. The topological areas $\bar{f}_a$ and $\bar{f}_c$ belonging to the basic volume $V_2$ are now "hanging" partially in the air, and the topological edges $\bar{e}_{ad}$ and $\bar{e}_{cd}$ as well as the topological area $\bar{f}_d$ are "hanging" completely in the air. The prerequisites for additional linkings, independently from the sequence, are created by this information, which is additional information compared with the modeling according to the Boundary Representation.

In the process according to the present invention, the feature level represents the highest description level at which the possibilities of description necessary for the knowledge-based problem solver are available: It is possible to represent objects (and consequently also geometric features), their attributes, as well as relationships and constraints between these objects. Attribute values may be, e.g., geometric shapes of any dimension. Constraints, which describe relationships at the other levels, can be specified between different geometric attributes (volumes, areas, parameters, . . . ), depending on the type of the attributes. Semantic information can be linked with geometry by means of attributes. The feature level has the following possibilities of description:

| feature: feature-type | ;;; can be defined by the |
| --- | --- |
| | ;;; user |
| feature-parameters | ;;; parameter needed for the |
| | ;;; description |
| parts | ;;; description of the structure of |
| | ;;; the feature by elementary |
| | ;;; features or basic volumes |
| feature attributes | ;;; semantic information |
| constraints | ;;; various attributes, |
| | ;;; "parts," etc. |

The user-defined relations offer the possibility of describing many different relationships between partial geometries as part of the interface from the geometry modeling to the knowledge representation.

Figure 5:
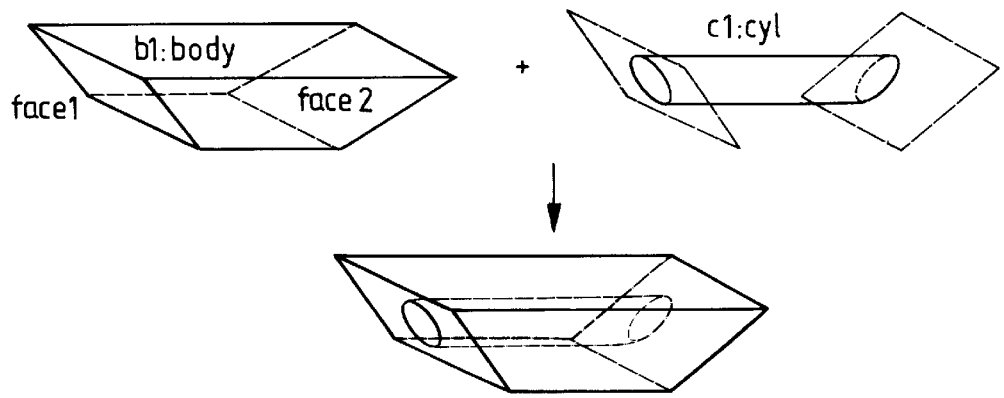
FIG. 5 is a representation of a relationship between a certain basic volume and a cylinder, which are correlated via two areas.

FIG. 5 shows a representation according to the present invention of a relationship between a basic volume 'b1' of the 'body' type and a cylinder 'c1,' which are correlated via the body areas 'face1' and 'face2.'

As an example, a workpiece 'workpiece-x' can be described as a feature, e.g., as follows:

| feature: workpiece-x | |
| --- | --- |
| feature-parameters: | length, width, height |
| parts: | main-body: box, |
| | x-slot: slot, |
| | y-hole: cylinder-hole |
| attributes: | material: aluminum100, |
| | manufactured: machine-type-xyz |
| constraints: | x-slot.dir = main-body.dir, |
| | y-hole.dir = main-body. |
| | dir + 90, . . . ; | with the meaning that this workpiece has a geometric shape which is composed of a parallelepipedic main body, has a slot in the x direction in it and a cylindrical hole in the y direction. (For reasons of transparency, the constraints, which express the geometric relationships between these features, are not represented.). The types 'box,' 'slot' and 'cylinder-hole' are basic volumes with corresponding densities. The attributes given illustrate the integration of semantic information with the geometry. The constraints illustrate the relationships existing between the different partial geometries in this area only in sections.

In the process according to the present invention, the feature level forms the interface between the knowledge representation level and the geometry modeling.

Thus, the present invention offers the possibility of dynamically defining partial geometries, namely, by establishing relations to other partial geometries. The logic-relational description possibilities, on which the feature representation is based in the process according to the present invention, are used for this purpose. FIG. 5 shows an example for this. It is important that the problem solver be able to resolve the degrees of freedom, which the feature description may contain, to the extent that a complete description of the geometry is obtained.

The possibilities of expressing different forms of relationships explicitly are of crucial significance for the integration of knowledge processing and geometry modeling. The process according to the present invention therefore offers an expressive, declarative modeling of constraints. The following categories of relationships exist:

Equality conditions between any objects. This is important for the interface between the logic-relational description at the feature level and the geometry modeling (see FIG. 5).

'Built-in' relations, which express the relationships at and between defined levels (e.g., between generic descriptions and corresponding topological instances). These explicitly reflect the modeling possibilities which the process according to the present invention offers for the "actual" geometry. The relations existing between the different objects of the geometry modeling can thus be explicitly included in the problem solving.

Arithmetic and geometric constraints between geometric parameters (in the form of equations and inequalities).

Geometric relations, such as "parallel" or "perpendicular."

User-defined relations, e.g., the "part" relationships between one feature and the features "contained" in it.

Logic linkings between the said "elementary" forms of constraints.

To ensure the declarativity of the representations, special methods are needed for the treatment of the arithmetic/geometric constraints as well as for the logical relationships. Depending on the possibilities of these methods, corresponding limitations are necessary in the expressiveness of the constraints.

The geometric relations (such as "parallel," "perpendicular," etc.) are ultimately projected to the equivalent relations between the geometric parameters.

User-defined relations as a form in the process according to the present invention for defining relations between geometric "entities" impart high flexibility to the modeling. Relations between geometric units can be described in such a manner which corresponds, e.g, to the knowledge in a knowledge base (cf., e.g., FIG. 5 with an example, where the geometry of the workpiece is described in its components, namely, main body, x-slot and y-hole). However, it is decisive, besides this possibility of description, that the meaning intended by the user for such relations can be expressed by the intended modeling. This requires the possibility of defining this meaning. The logic relations, which can be defined between the different forms of constraints, are used for this purpose in the present invention. For example, the meaning of a relation "connected" between two parallelepipedic objects can be represented as follows:

Connected (X: box, Y: box) → X · x-coord = Y · x-coord

X · y-coord = Y · y-coord + Y · width,

X · z-coord = Y · z-coord, in which "→" symbolizes the logic implication. As soon as such a connected relation exists between two volumes of the "box" type, the coordinates of the two objects are "constrained" in the given manner.

In this sense, user-defined relations are also a kind of "macro" for the abbreviated notation of sets of constraints.

It is possible to express, e.g., that the bottom face of the "slot" and the top face of the main body shall be parallel in the example of the workpiece given:

X:work-piece→parallel(X.main-body.top, X.x-slot.bottom)

The corresponding constraints between the geometric parameters are then established by a suitable definition of the "parallel" relation between levels (again by a logic linking with the geometric parameters of the areas involved).

The advantage of the modeling by the process according to the present invention is that all relevant relations between geometric "entities," which may be part of the modeling, can be used in the knowledge representation and be represented declaratively as constraints. These possibilities of representation are explicitly available as part of the description language (as a set of "built-in" relations).

The process according to the present invention is based on a logic-relational geometric description. The individual forms of representations consequently designate either individual "entities" or sets of "entities," depending on the meaning of the relation. It may be occasionally meaningful to consider the individual elements or the cardinal nature of the set of objects designated by such a relation:

Let, e.g., "top-inst" be the built-in relationship between a generic area f and the set I of its topological instances in a solid $\Gamma$. Now, I=top-inst (f,$\Gamma$)

designates this relationship. This relationship between this set I and its elements can then be described as follows:

$I=\{\bar{f}_1, \bar{f}_2, \ldots \bar{f}_n\}$

If the set of the elements is to be represented explicitly and its cardinal nature is to be expressed explicitly, this can be done by the following notation of the set:

| | |
|---|---|
| $\{\bar{f}_1, \bar{f}_2\}$ = top $inst(f, \Gamma)$ | expresses that there are exactly 2 instances in the solid $\Gamma$ |
| $\{\bar{f}_1\}$ = top-$inst(f, \Gamma)$ | expresses that there is exactly 1 instance in the solid $\Gamma$ |
| $\{\}$ = top-$inst(f, \Gamma)$ | expresses that there is no instance in the solid $\Gamma$ |

It should be taken into account in this connection that certain contents of the geometric representation may change in a nonmonotone manner due to the addition of new geometric information. Consequently, if, e.g., a topological instance of a generic area is explicitly represented by a corresponding constraint, and this one instance is eliminated or divided by further geometry modeling steps, this constraint is violated. This means a global inconsistency, which normally leads to the rejection of the corresponding modeling step.

If the elements of such a set are to be designated, a "member" relation is present in the process according to the present invention. A certain attribute (e.g., "color") can be defined by means of this relation, e.g., for all topological instances f of the said generic area f:

I=top-inst(f,$\Gamma$), F=member(I)→F.color=red.

The following types of built-ins can be specifically distinguished in the process according to the present invention:

a) Direct relations: All representations which are explicitly contained in the representation, e.g., the origin relation, the parts relation, etc., are called direct relations.

b) Derived relations:

Some geometric relationships are of such a significance that built-in relations exist for them, even though they are not explicitly part of the modeling: For example, Edges=gen-edges($f_1, f_2$)

designates the set of all generic edges which form the section of the two generic areas $f_1$ and $f_2$. (It is thus also possible, e.g., to express the requirement that two generic areas form only one cut edge: $\{e_{12}\}$=gen-edges $(f_1, f_2)$.) Logically, this relation represents the set of cuts from the "edges" relations of the two generic areas involved:

gen-edges(F1, F2)=F1.edges∩F2.edges.

Figure 6:
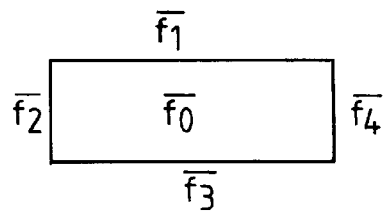
FIG. 6 is a generic and topological representation of a rectangle (without the corresponding geometric constraints)
Figure 6:
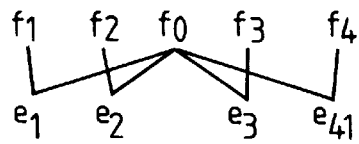
Figure 6:
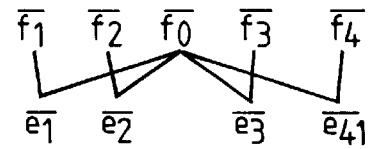

However diverse the geometry modeling possibilities are in the process according to the present invention, not all relationships can be directly described. If, e.g., the topological instance $\bar{f}_0$ of a plane $f_0$ in a geometry model is or shall be a rectangle, this cannot be directly expressed here. This rectangle is formed due to the fact that the four other planes $f_1$, $f_2$, $f_3$ and $f_4$, which "cut" the rectangle out of the generic plane $f_0$, are represented with the corresponding topological and geometric constraints. This is shown in FIG. 6 in connection with the generic and topological representation of a rectangle (without the corresponding geometric constraints).

Figure 7:
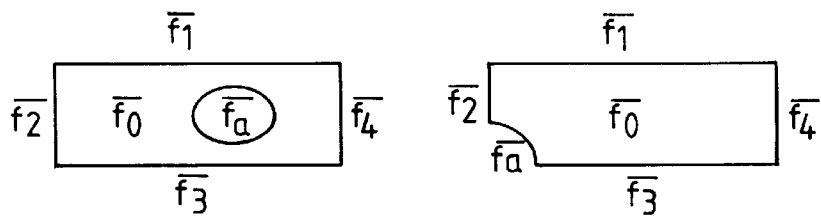
FIG. 7 is a generic and topological representation of "non-rectangles" (without geometric constraints).
Figure 7:
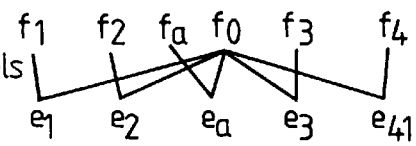
Figure 7:
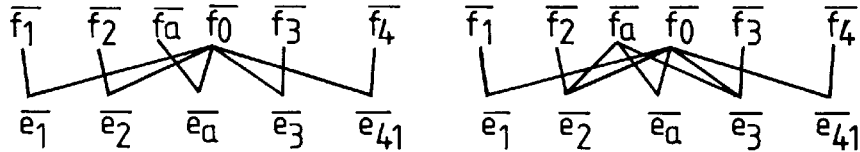

Even though this seems to be cumbersome at first glance, such a representation offers a number of advantages, besides the close conceptual tie-in in the "rest" of the scheme of the process according to the present invention:

- It is possible to formulate a priori constraints which ensure that a certain topology will be preserved (i.e., by requiring for the topological instance $\bar{f}_0$ that it form a rectangle with the areas $f_1$, $f_2$, $f_3$ and $f_4$), as a result of which it is possible, e.g., to prevent "non-rectangles" from being formed, as in FIG. 7, due to additional geometric linkings.
- It is possible to determine a posteriori the class to which a given topological instance belongs (i.e., e.g., "rectangle" or "rectangle with circular opening" as in FIG. 7), i.e., a topological classification can be performed.

The possibility of specifying topological constraints is useful in many respects. It is possible to achieve as a result, e.g., that the problem solver will not initiate any changes in the overall geometry which would lead to inconsistent states. If, e.g., a hole is specified as a blind hole, it is possible to prevent the lower limiting area of the hole from being "cut up" due to a corresponding topological constraint being specified.

Topological constraints also offer the possibility of describing and analyzing feature interactions. Two different aspects are meant here:

- On the one hand, feature interactions may be intended, i.e., a certain relation is inherently set between them by the problem solver (or user) at the feature level. Topological constraints now offer the possibility of accurately specifying the type of the interaction (e.g., two cylindrical surfaces shall intersect each other along one fourth-order section curve only).
- On the other hand, feature interactions are generated as a result of the interaction at the geometric level: Consequently, they are not intended, but not necessarily forbidden or undesired, either. They may even be important from the viewpoint of the problem solver, so that they are treated "only" by the geometry modeler. However, they may be very important for the consistency of the overall geometry, so that they must be signaled by the geometry modeler to the problem solver. This interest of the problem solver in such a feature interaction can be represented by topological constraints.

The addition of new partial geometries (volumes) to an existing geometric model may cause that topological instances which have hitherto been contained in the model are no longer contained in it. Since this may be a circumstance that is of significance for the problem solver, the process according to the present invention provides for the relation "holds," with which it is possible to represent whether a certain topological instance $\bar{t}$ (area, edge, point) is contained in the current solid $\Gamma$:

holds($\bar{t}$, $\Gamma$) is synonymous with $\bar{t}$ is contained in the current solid $\Gamma$.

What makes this relation interesting for knowledge processing is its "anti-monotonicity:" If ¬ holds($\bar{t}$, $\Gamma$) is true for a topological instance $\bar{t}$ in a model, this is also true of the model which was formed from it by adding new partial geometries.

Consequently, if, e.g., a generic area forms a cut edge, which has no topological instance, with another one, it will not receive one even by the addition of more geometry, and thus it also does not have to appear in the representation of the generic edges at all.

It is often important for the problem solver that certain elements in the overall geometry satisfy a condition: For example, that the length of an edge satisfy a certain constraint. This constraint shall be valid regardless of changes in topology, which also modify, e.g., the end points of that edge. It would therefore be meaningful to formulate such a constraint as a distance constraint at the end points of the edge, since these are subject to the changes in topology. The constraint must be described at the topological edge itself and be adapted as a function of topological changes.

It is vitally important from the viewpoint of a knowledge-based system and especially of an interactive one to know the dependence between the individual "data," which are part of the solution just being investigated or generated, and to take it into account in the problem solving.

The process according to the present invention offers the possibility for this due to the explicit modeling of the different geometric relationships. It is unambiguously clear for each basic volume, each generic area or edge and for each topological instance by what geometric features it was "caused." In the case of a revision of a feature by the problem solver, it is thus simple to revise all the geometric entities linked with it as well. The subsequent "constructive" step, namely, the repair of the changes in the entire geometry, which are caused by the elimination of one feature, is not quite so simple. The local geometric operations must be basically performed again at all these sites in order to calculate the revised overall geometry (including the topology).

To achieve the unambiguity between the description at the knowledge level (the features and their relations) and the individual geometric "entities," it is, however, necessary to take into account one important circumstance, namely, the monotony properties of the geometry. If we assume that each "action" 'x,' which leads to a new feature, a new relation between features, etc., is represented by a corresponding decision '$d_x$,' then there exists a certain topological instance $\bar{t}$ in the entire geometry model based on a certain set of such decisions (which represents a partial set of all decisions made by the problem solver up to now):

$\{d_x, d_y, \ldots d_z\}$|=holds (t, $\Gamma$)

The topological instance can be changed by a further decision $d_0$ (so that it is no longer valid in the logical sense): It can thus fall completely out of the new overall geometry ⊗, it can be modified, divided, "merged" with another topological instance to one, etc.:

$$t\{d_x, d_y, \ldots, d_z, d_0\}| = \neg \text{ holds}(\bar{t}, \Gamma \otimes \Gamma') \text{ or}$$

$$\{d_x, d_y, \ldots, d_z, d_0\}| = \neg \text{ holds }(\bar{t}, \Gamma \otimes \Gamma'), \text{ holds }(\bar{t}, \Gamma \otimes \Gamma')$$

or $$\{d_x, d_y, \ldots, d_z, d_0\}| = \neg \text{ holds }(\bar{t}, \Gamma \otimes \Gamma'), \text{ holds }(\bar{t}_1, \Gamma \otimes \Gamma'),$$

$$\text{holds }(\bar{t}_2, \Gamma \otimes \Gamma') \ldots$$

Even though holds (t, $\Gamma \otimes \Gamma'$) is true in a subset $\{dx, dy, \ldots, dz\}$ of the current decision set $\{dx, dy, \ldots, dz, d0\}$, it is no longer true in the set $\{d_x, d_y, \ldots, d_z, d_0\}$, which is a monotone expansion of $\{dx, dy, \ldots, dz\}$.

These relationships cannot be treated in a manner that is otherwise typical for dependence maintenance (i.e., where it is possible to indicate for each subset of decisions what statements are valid in that set); this is not practicable. A favorable compromise is to represent the overall geometry for each total set of decisions and to revise in it the subset of decisions which has led to this actual relationship for every individual relationship with respect to the total set of decisions. If one of the decisions is revised (withdrawn), it is immediately possible to state which geometric relations lose their validity as a consequence, but a new calculation of the geometry at the modified sites is necessary to determine which geometric relationships are now valid again.

While specific embodiments of the invention has been shown and described in detail to illustrate the application of the principles of the invention, it will be understood that the invention may be embodied otherwise without departing from such principles.

What is claimed is:

1. A process for the computer-aided geometry modeling of a workpiece, comprising the steps of:
    providing an integrated, declarative, sequence-independent and logic-based representation of the volume, area, edge, point and topology-related information in the form of a representation element ($\Gamma$), comprising individual basic volumes, to which a density ($\rho$) is assigned in the form of a real number (positive, zero, negative);
    performing a linking of individual representation elements ($\Gamma$) by a commutative and associative linking operation; and
    creating description levels for the actually relevant information, also in their mutual dependence, in the form of a
        volume level as the basic level for the description of elementary structures, whose composition is permanently preset,
        topology level as a representation of the overall geometry, and
        a generic area level located between the volume level and the topology level, and a generic edge level likewise located there for establishing the relationship between the topological structures and the volumes generating them.

2. The process in accordance with claim 1, further comprising the step of:
    creating an information unit level as a feature level located above the description levels, at which information unit level objects (features) are defined in terms of their volume, area, point and topology related information with their attributes as well as the relations and dependences existing between them in the description levels.

3. The process in accordance with claim 1, further comprising using a knowledge-based system, which utilizes the possibilities of a geometry and feature description.

4. The process in accordance with claim 1, further comprising providing in the topology level both between areas and edges and between edges and points a defines relation and a constrains relation as two different types of topological relations, said defines relation describing the topology, and said constrains relation expressing that an object influences the topology of another object without being influenced itself.

5. The process in accordance with claim 1, wherein geometric models are a priori classified topologically in their description.

6. The process in accordance with claim 1, further comprising introducing for the topology level a holds relation, which states whether a defined topological, generic or volume instance is present in a current geometric model.

7. The process in accordance with claim 1, wherein the overall geometry is represented for each total set of decisions, and a subset of decisions which has led to a particular relationship is represented in said overall geometry for every individual relationship with respect to the total set of decisions, so that parts of the geometry which are linked with these decisions can be identified at the time of a change in the decisions.

8. The process in accordance with claim 2, further comprising using a knowledge-based system, which utilizes the possibilities of a geometry and feature description.

9. The process in accordance with claim 2, further comprising providing in the topology level both between areas and edges and between edges and points a defines relation and a constrains relation as two different types of topological relations, said defines relation describing the topology, and said constrains relation expressing that an object influences the topology of another object without being influenced itself.

10. The process in accordance with claim 2, wherein geometric models are a priori classified topologically in their description.

11. A system for the computer-aided geometry modeling of a workpiece, comprising the steps of:
    means for providing an integrated, declarative, sequence-independent and logic-based representation of the volume, area, edge, point and topology-related information in the form of a representation element ($\Gamma$), comprising individual basic volumes, to which a density ($\rho$) is assigned in the form of a real number (positive, zero, negative);
    means for performing a linking of individual representation elements ($\Gamma$) by a commutative and associative linking operation; and
    means for creating description levels for the actually relevant information, also in their mutual dependence, in the form of a
        volume level as the basic level for the description of elementary structures, whose composition is permanently preset,
        topology level as a representation of the overall geometry, and a generic area level located between the volume level and the topology level,
        and a generic edge level likewise located there for establishing the relationship between the topological structures and the volumes generating them.

12. The system in accordance with claim 11, further comprising:
    means for creating an information unit level as a feature level located above the description levels, at which information unit level objects (features) are defined in terms of their volume, area, point and topology related information with their attributes as well as the relations and dependences existing between them in the description levels.

13. The system in accordance with claim 11, further comprising a knowledge-based system, which utilizes the possibilities of a geometry and feature description.

14. The process in accordance with claim 11, further comprising means for providing in the topology level both between areas and edges and between edges and points a defines relation and a constrains relation as two different types of topological relations, said defines relation describing the topology, and said constrains relation expressing that an object influences the topology of another object without being influenced itself.

15. The system in accordance with claim 11, wherein said means to create description levels classifies geometric models topologically in their description.

16. The system in accordance with claim 11, further comprising means for introducing for the topology level a holds relation, which states whether a defined topological, generic or volume instance is present in a current geometric model.

17. The system in accordance claims 11, wherein the overall geometry is represented for each total set of decisions, and a subset of decisions which has led to a particular relationship is represented in said overall geometry for every individual relationship with respect to the total set of decisions, so that parts of the geometry which are linked with these decisions can be identified at the time of a change in the decisions.

* * * * *